United States Patent
Adams et al.

(10) Patent No.: US 9,007,857 B2
(45) Date of Patent: Apr. 14, 2015

(54) SRAM GLOBAL PRECHARGE, DISCHARGE, AND SENSE

(71) Applicant: International Business Machines Corporation, Armonk, NY (US)

(72) Inventors: Chad A. Adams, Byron, MN (US); Sharon H. Cesky, Rochester, MN (US); Elizabeth L. Gerhard, Rochester, MN (US); Jeffrey M. Scherer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 13/655,003

(22) Filed: Oct. 18, 2012

(65) Prior Publication Data

US 2014/0112060 A1     Apr. 24, 2014

(51) Int. Cl.
*G11C 7/12* (2006.01)
*G11C 7/18* (2006.01)
*G11C 11/413* (2006.01)

(52) U.S. Cl.
CPC .............. *G11C 11/413* (2013.01); *G11C 7/12* (2013.01); *G11C 7/18* (2013.01)

(58) Field of Classification Search
CPC ...... G11C 11/413; G11C 11/416; G11C 7/10; G11C 7/12
USPC .............................. 365/203, 154, 188, 189.15
See application file for complete search history.

(56) References Cited

U.S. PATENT DOCUMENTS

| | | | |
|---|---|---|---|
| 5,724,292 A * | 3/1998 | Wada ............................ | 365/207 |
| 6,002,626 A | 12/1999 | Lattimore et al. | |
| 6,442,089 B1 | 8/2002 | Fletcher et al. | |
| 7,355,881 B1 | 4/2008 | Dankert et al. | |
| 7,535,776 B1 | 5/2009 | Behrends et al. | |
| 7,724,586 B2 | 5/2010 | Adams et al. | |
| 8,335,120 B2 * | 12/2012 | Shinohara ..................... | 365/203 |
| 2005/0013159 A1 * | 1/2005 | Iwahashi et al. ............. | 365/154 |
| 2008/0112234 A1 * | 5/2008 | Tokito ...................... | 365/189.16 |
| 2008/0298137 A1 | 12/2008 | Chan et al. | |
| 2009/0116324 A1 * | 5/2009 | Christensen et al. ......... | 365/203 |
| 2009/0141570 A1 * | 6/2009 | Hsu et al. ...................... | 365/191 |
| 2009/0175107 A1 * | 7/2009 | Christensen et al. ......... | 365/203 |

* cited by examiner

*Primary Examiner* — Douglas King
(74) *Attorney, Agent, or Firm* — Peder M. Jacobson; Robert R. Williams

(57) ABSTRACT

An SRAM includes a global bit line, an SRAM cell, precharge logic, discharge logic, and sense logic. The SRAM cell stores a first logical value or a second logic value and is coupled to the global bit line. The precharge logic may charge the global bit line to a precharge voltage for a non-read operation and a boosted voltage that is greater than a reference voltage for a read operation. The discharge logic may either maintain the global bit line at the boosted voltage for the first logical value or discharge the global bit line to a discharge voltage that is less than the reference voltage for the second logical value. The sense logic may output the first logical value when the global bit line has the boosted voltage or may output the second logical value when the global bit line has the discharge voltage.

10 Claims, 6 Drawing Sheets

FIG. 1 – Prior Art

SRAM GLOBAL PRECHARGE, DISCHARGE, AND SENSE

TECHNICAL FIELD

The present disclosure relates to a read operation in a static random-access memory (SRAM). In particular, an SRAM global bit line precharge, discharge, and sense operation is described.

BACKGROUND

SRAMs may be arranged in a domino-logic structure with a local bit line coupled to a number of SRAM cells and a global bit line that may be discharged when the local bit line is discharged. SRAM cells are connected in parallel to write/precharge logic through the local bit line. The local bit line in a domino SRAM is precharged high by the write/precharge logic and may be discharged to ground by a selected cell during a read operation. The local bit line is coupled to a transistor which may discharge the global bit line. In order for the SRAM circuit to function, the global bit line must be precharged.

FIG. 1 is a schematic representation of a portion of a prior art SRAM circuit 100 having local evaluation logic 106, a global bit line (GBL) 102, and global bit line precharge logic 107. The local evaluation logic 106 contains write/precharge logic 101 and global bit line discharge logic 108. One or more SRAM cells 105 are connected to the write/precharge logic 101 and the global bit line discharge logic 108 via a local bit line (LBL) 104, and are accessed by a word line (WL) 109. For a read operation, LBL 104 is precharged by the write/precharge circuit 101 and may be discharged by a selected SRAM cell 105. GBL 102 is precharged by the global bit line precharge logic 107 and discharged by the global bit line discharge logic 108.

As an illustration, to read a "zero" from a cell 105, the selected SRAM cell 105 may pull down the precharged LBL 104. The "zero" value on LBL 104 is inverted to a "one" by either an inverter 1I1 for configurations where only one group of cells is connected to local evaluation logic 106 or a NAND gate for configurations where two groups of cells are connected to local evaluation logic 106, and turns on a transistor 1N1, which pulls down the precharged GBL 102. GBL 102 is sampled and subsequently precharged for a next operation by a global bit line precharge line (GBL_PCH) 103 and an associated transistor 1P1.

SUMMARY

In an embodiment of the invention, an SRAM includes a global bit line, an SRAM cell, precharge logic, discharge logic, and sense logic. The SRAM cell stores one of a first logical value or a second logic value and is coupled to the global bit line. The precharge logic may precharge the global bit line to a precharge voltage that may be equal to a reference voltage. During a read operation, the precharge logic may either charge the global bit line to a boosted voltage that is higher than the reference voltage for the first logical value stored on the SRAM cell or the discharge logic may discharge the global bit line to a discharge voltage that is less than the reference voltage for the second logical value stored on the SRAM cell. The sense logic may output the first logical value when the global bit line has the boosted voltage or may output the second logical value when the global bit line has the discharge voltage.

In another embodiment of the invention, a method for reading an SRAM cell having one of a first logical value or a second logical value in a domino SRAM includes precharging a global bit line to a precharge voltage that may be equal to a reference voltage. The global bit line may be either charged to a boosted voltage that is greater than the reference voltage for the first logical value stored in the SRAM cell or discharged to a discharge voltage that is less than the reference voltage for the second logical value stored in the SRAM cell. The first logical value may be outputted if the global bit line voltage is at the boosted voltage or the second logical value may be outputted if the global bit line voltage is at the discharge voltage.

In another embodiment of the invention, a design structure tangibly embodied in a machine-readable storage medium is used in a design process of an SRAM. The design structure has elements that, when processed in a semiconductor manufacturing facility, produce an SRAM. The SRAM includes a global bit line, an SRAM cell, precharge logic, discharge logic, and sense logic. The SRAM cell stores one of a first logical value or a second logic value and is coupled to the global bit line. The precharge logic may precharge the global bit line to a precharge voltage that may be equal a reference voltage. For a read operation, the precharge logic may either charge the global bit line to a boosted voltage that is greater than the reference voltage for the first logical value stored on the SRAM cell or the discharge logic may discharge the global bit line to a discharge voltage that is less than the reference voltage for the second logical value stored on the SRAM cell. The sense logic may output the first logical value when the global bit line has a voltage greater than the reference voltage or may output the second logical value when the global bit line has voltage less than the reference voltage.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of embodiments of the invention and do not limit the invention.

DETAILED DESCRIPTION

According to embodiments of the invention, an SRAM (static random access memory) read operation may be performed through a boosted voltage and partial discharge or lack of discharge of a global bit line. An SRAM global bit line may be coupled to precharge logic, sense logic, and local evaluation logic. During a non-read operation, the precharge logic may apply a precharge voltage that may be equal to a reference voltage. The local evaluation logic may contain discharge logic and one or more SRAM cells, each SRAM cell storing a "one" or a "zero". During a read operation, the global bit line may float until the precharge logic charges the global bit line to a boosted voltage that is greater than the reference voltage. The discharge logic may pull down the global bit line to a discharge voltage that is below the reference voltage. The sense logic may detect the global bit line voltage as above or below the reference voltage, and output a corresponding "one" or "zero."

In other embodiments of the invention, the precharge logic selects between more than one voltage when the global bit line is left floating by the local evaluation logic. During a write operation, the precharge logic may apply a write voltage to the global bit line when it is left floating. During a read operation, the precharge logic may apply a boosted read voltage to the global bit line when it is left floating.

Power and space conservation and reduction are becoming increasingly important as circuit technology advances. Repeatedly discharging a global bit line down to source voltage and returning the global bit line to precharge voltage requires energy and limits the number of memory cells and local evaluation logic circuits that may operate a global bit line. Partially discharging a global bit line may enable more local evaluation logic circuits to be coupled to a single global bit line. Decreasing wiring congestion and power consumption may enable higher density chips with less power consumption.

Figure 1:
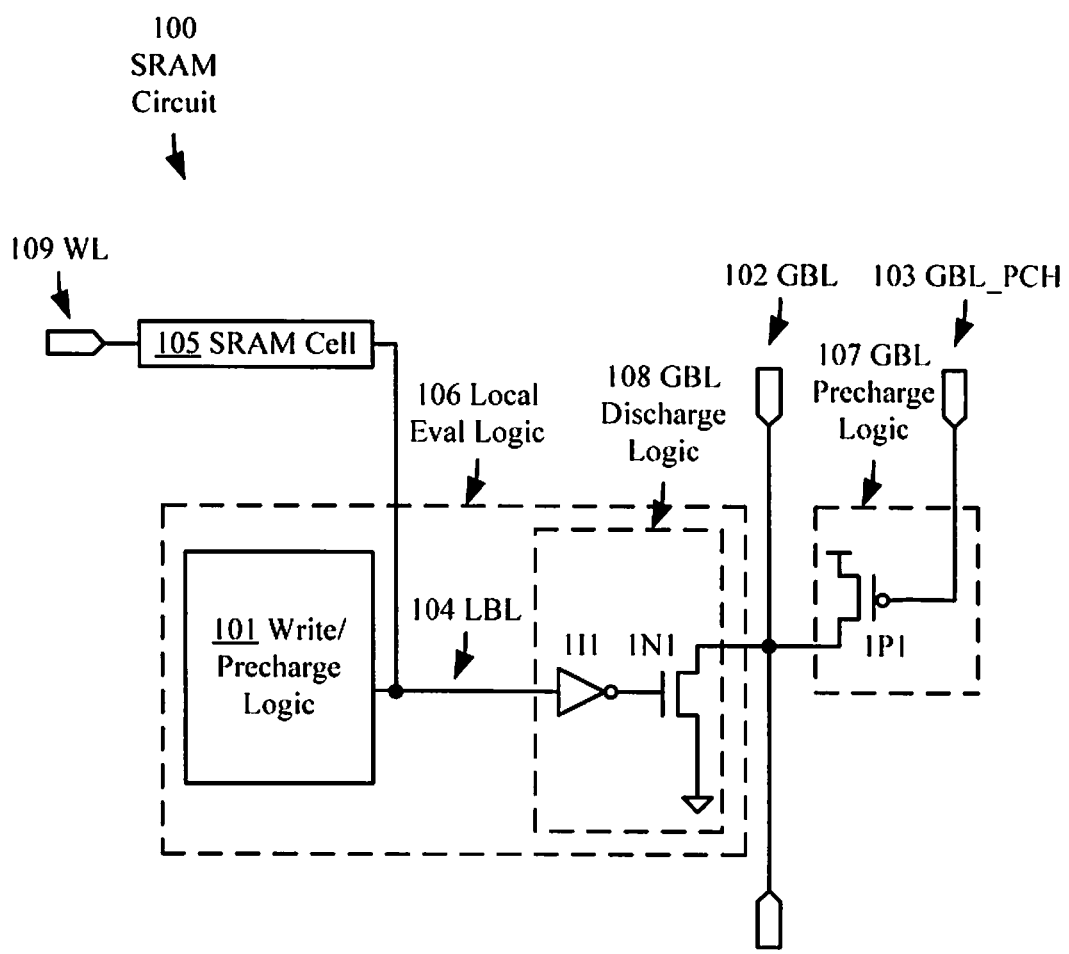
FIG. 1 is a schematic representation of a portion of a prior art SRAM circuit having a global bit line, global bit line discharge logic, and global bit line precharge logic.
Figure 2:
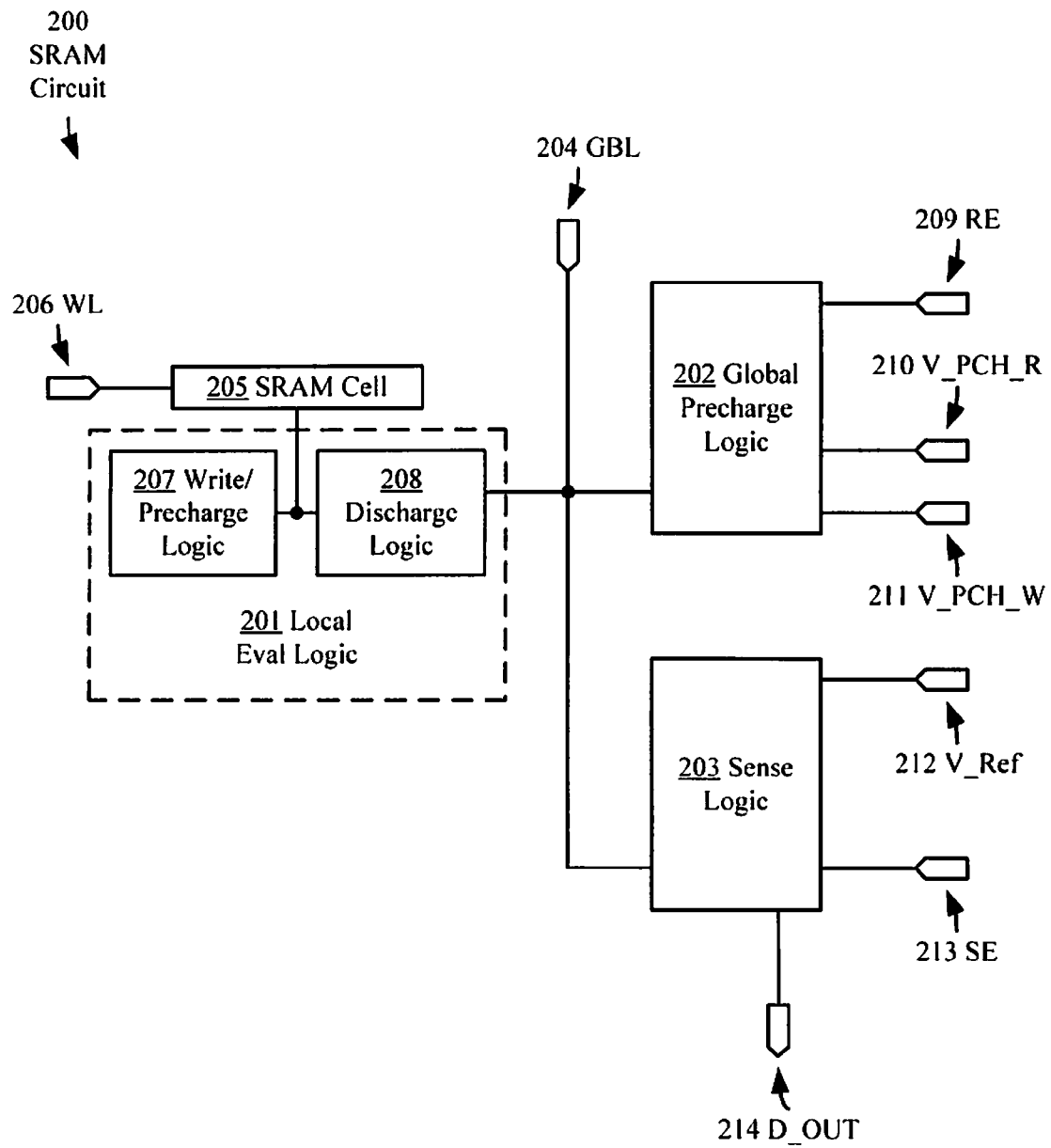
FIG. 2 is a diagrammatic representation of a portion of an SRAM circuit having precharge logic, discharge logic, and sense logic coupled to a global bit line, according to embodiments of the invention.

FIG. 2 is a diagrammatic representation of a portion of an SRAM circuit 200 having local evaluation logic 201, global precharge logic 202, and sense logic 203 coupled to a global bit line (GBL) 204, according to embodiments of the invention. Local evaluation logic 201 may be coupled to one or more SRAM cells 205 operated by a word line (WL) 206 and may contain write/precharge logic 207 and discharge logic 208. The global precharge logic 202 may supply GBL 204 with a precharge voltage during a non-read operation and a boosted voltage for a read operation. The global precharge logic 202 may be operated by a read enable line (RE) 209 and may be supplied voltage by a boosted read line (V_PCH_R) 210 and a precharge write line (V_PCH_W) 211. RE 209 may select between V_PCH_R and V_PCH_W, depending on whether a read or non-read operation (e.g., write or no operation) is taking place. The discharge logic 208 may maintain a boosted voltage above a reference voltage for a first logical value stored in a selected SRAM cell or may partially discharge GBL 204 to a discharge voltage below the reference voltage for a second logical value stored in the selected SRAM cell. The sense logic 203 may sense the voltage of GBL 204, compare it to a reference voltage from a reference voltage line (V_Ref) 212, and output a value corresponding to the first logical value or the second logical value. The sense logic 203 may be operated by a sense enable line (SE) 213, may receive GBL 204 and V_Ref 212, and may output to a data out line (D_Out) 214.

In an embodiment of the invention, the reference voltage may be a chip supply voltage. In another embodiment, the precharge voltage may be the same as the reference voltage described above.

Figure 3:
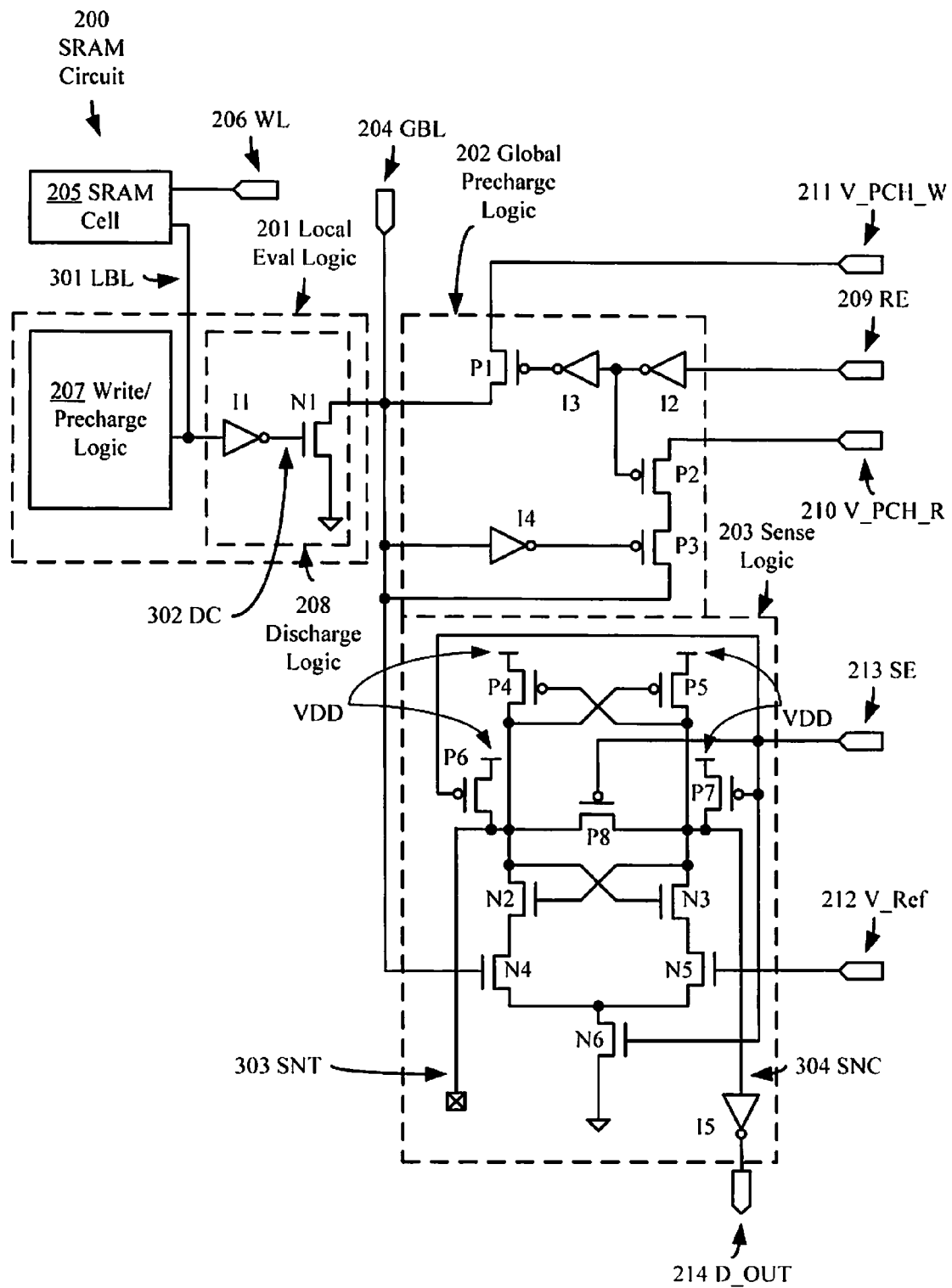
FIG. 3 is a schematic representation of a portion of an SRAM circuit having precharge logic that may precharge a global bit line with a precharge voltage or charge the global bit line with a boosted read voltage, discharge logic that may discharge the global bit line to a discharge voltage, and sense logic that may sense a voltage on the global bit line that is greater than or less than a reference voltage, according to embodiments of the invention.

FIG. 3 is a schematic representation of a portion of an SRAM circuit 200 having global precharge logic 202 that may precharge and charge a global bit line (GBL) 204, discharge logic that may discharge GBL 204, and sense logic 203 that may sense a voltage on GBL 204 that is greater than or less than a reference voltage, according to embodiments of the invention.

Non-Read Precharge Operation

In embodiments of the invention, the global bit line may be precharged to a standard reference voltage, such as a chip supply voltage, for a non-read operation, such as a write operation. For a non-read operation, the read enable line (RE) 209 may remain low. RE 209 inputs low into an inverter I2 and causes I2 to output high. The high output of I2 inputs into inverter I3 and causes I3 to output low. The low output from I3 inputs into a voltage precharge transistor P1 and turns on P1. A drain of P1 is coupled to GBL 204 and a source of P1 is coupled to a precharge write line (V_PCH_W) 211. When P1 is turned on, V_PCH_W 211 may charge GBL 204 to a write precharge voltage. The write precharge voltage on GBL 204 inputs into inverter I4 and causes I4 to output low. The low output from I4 turns on a read precharge gate transistor P3. A drain of P3 is coupled to GBL 204 and a source of P3 is coupled to a read precharge transistor P2. The high output from I2 turns off P2. A drain of P2 is coupled to P3 and a source of P3 is coupled to a boosted read line (V_PCH_R) 210.

Read Operation

In embodiments of the invention, the global bit line may be charged by the precharge logic 202 to a boosted read voltage that is greater than a reference voltage for a read operation and maintained at a voltage above the reference voltage for a read operation of a first logical value. V_PCH_R 210 is a higher voltage than V_PCH_W 211. For a read operation of a "one", RE 209 goes high and inputs into inverter I2, which causes I2 to output low. The low output from I2 inputs into inverter I3 and causes I3 to output high. The high output from I3 turns off P1, which isolates V_PCH_W 211 from GBL 204. The low output from I2 turns on P2. GBL 204 inputs high into inverter I4, which causes I4 to output low and turn on P3. With P2 and P3 turned on, V_PCH_R 210 provides a boosted precharge voltage to GBL 204, which may increase the voltage of GBL 204 above a reference voltage.

In embodiments of the invention, the global bit line may be discharged by the discharge logic 201 to a discharge voltage that is lower than the reference voltage for a read operation of a second logical value. A local bit line connected to the SRAM cell may operate a switch to create a path to discharge or block a path to discharge. Still referring to FIG. 3, to read a "zero" from the SRAM cell 205, WL 206 goes high. LBL 301, in this example a complement line carrying an inverted cell value, is precharged by write/precharge logic 207 and remains high. LBL 301 is coupled through an inverter I1 to a global bit line discharge transistor N1. A drain of N1 is coupled to GBL 204 and a source of N1 is coupled to ground. The high on the input to I1 causes I1 to output low, which drives DC 302 low and turns off N1. GBL 204, having been charged to a boosted read voltage as described above, may remain at the boosted read precharge voltage and above a reference voltage. Similarly, to read a "one" from a cell 205, WL 206 goes high. LBL 301 is pulled down by the cell and inputs low into I1. The low on the input to I1 causes I1 to output high and turn on N1. A turned-on N1 causes GBL 204 to be discharged below the reference voltage.

Sense Operation

In embodiments of the invention, sense logic 203 may output a first or second logical value depending on whether a global bit line carries a voltage above or below a reference voltage. Sense logic coupled to a global bit line may include a sense amplifier, such as a differential amplifier. The sense operation timing may be tuned so that the sense operation is enabled when the global bit line voltage is above the reference voltage for a first logical value and below the reference voltage for a second logical value. The timing for the sense operation may take into account the RC delay for resistive segments of GBL 204 due to capacitive loading from multiple local evaluation circuits coupled to GBL 204 or the length of GBL 204. Still referring to FIG. 3, GBL 204 operates a global bit line sense transistor N4 and a voltage reference line (V_Ref) 212 operates a reference voltage line sense transistor N5. Transistors P4 and N2 coupled to a sense node true (SNT) 303 and transistors P5 and N3 coupled to a sense node complement (SNC) 304 are arranged to form a latch which provides full rail voltage transition (e.g., ground to VDD) for D_OUT 214. Transistors P6 and P7 precharge SNT 303 and SNC 304, respectively, to VDD. An equalization transistor P8 may equalize SNT 303 and SNC 304 during a non-sense operation. A discharge transistor N6 may open a path to discharge for the sense transistors N4 and N5 during a sense operation. A sense enable line (SE) 213 may operate P6, P7, P8, and N6.

During a non-sense operation such as a write operation, SE 213 may be low, turning on P6 and P7 to precharge 303 SNT and 304 SNC to VDD, turning on P8 to equalize P6 and P7, and turning off N6 to remove a path to discharge. During a sense operation such as a read operation, SE 213 may be high, turning off P6, P7, and P8, and turning on N6 to add a path to discharge. If a "zero" is read as described above, GBL 204 may carry a boosted voltage and V_Ref 212 may carry a reference voltage. N4 and N5 are connected as a source-coupled differential pair. When GBL 204 is at a higher voltage than V_Ref 212, N4 will conduct most or all of the current through N6. N4 current will flow through N2, pulling down SNT 303. A low voltage on SNT 303 will turn off N3 and turn on P5, providing a high voltage on SNC 304 and a low voltage on D_OUT 214. A low voltage on D_OUT 214 causes a "zero" to be outputted on D_OUT 214. In addition to outputting the logical value stored in the SRAM cell 205, the value outputted on D_OUT 214 may be the complement of the logical value stored in the SRAM cell. While in this example the data out line 214 is coupled to SNC 304, D_OUT 214 may also be coupled to SNT 303. Additionally, GBL 204 may be operated by a local bit line true or may operate a transistor to discharge SNT 303.

Configuration for Shared Read/Write Local Bit Line

Certain SRAM cell designs have separate read and write lines for reading and writing to the cell. However, some designs, such as 6 transistor designs, use common bit lines for reading and writing to the cell. For shared common local bit lines in a domino design, writing to the cell may discharge the global bit line. According to embodiments of the invention, the SRAM circuit described above may be configured so that the global bit line may not be discharged during a write operation to the cell.

In an embodiment of the invention, a write operation may be performed on the above described invention through isolating the discharge path of GBL 204 during a write operation, such as an NFET coupled to the source of the discharge transistor operated by RE 209. In another embodiment, GBL 204 may be isolated from LBL 301 during a write operation, such as with an NFET between LBL 301 and GBL 204 operated by RE 209. In another embodiment, GBL 204 may be left floating during a write operation to ensure that a discharge of the global bit line would not create a path from V_PCH_W 211 to ground. RE 209 may be timed to go high during any write operation or during a write operation where GBL 204 would be discharged making it such that GBL 204 is left floating.

SRAM Timing

Figure 4A:
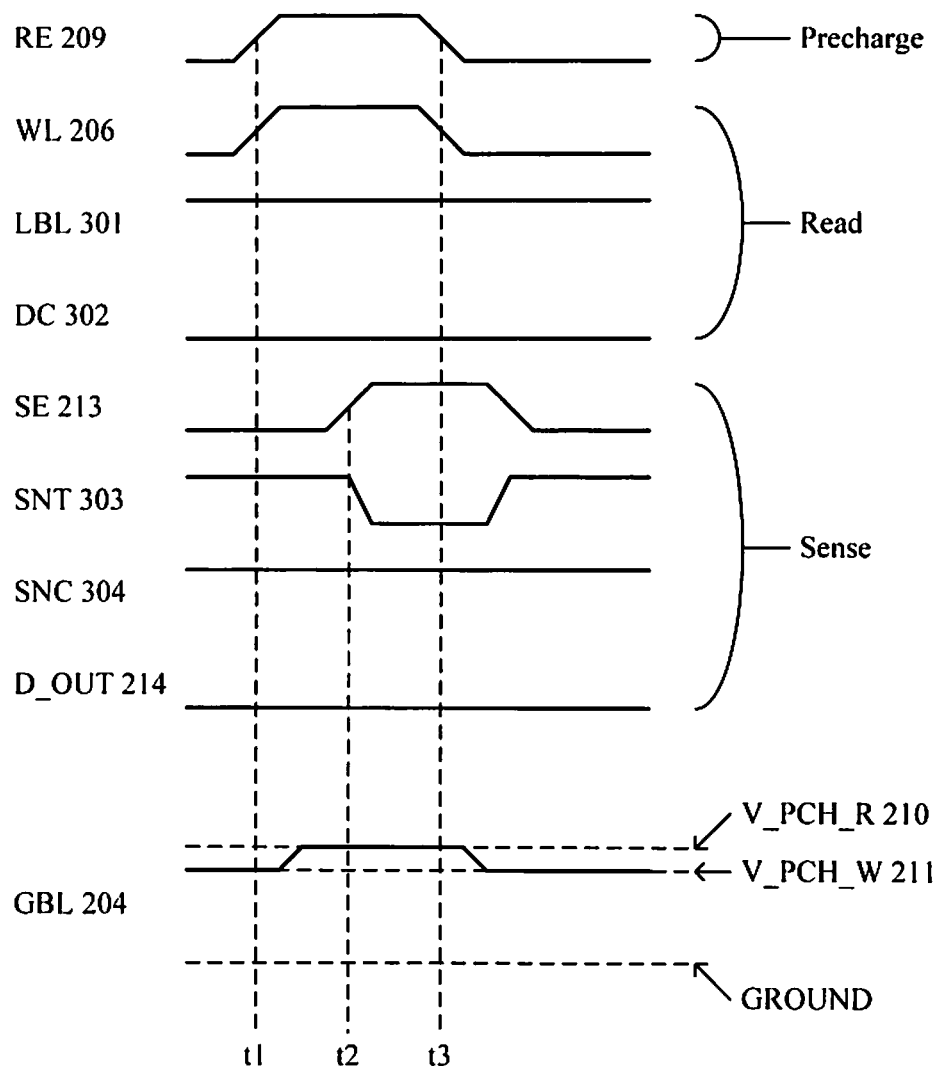
FIG. 4A is a timing diagram of a read operation of an SRAM cell having a "zero" value, according to embodiments of the invention.

FIG. 4A is a timing diagram of a read operation of an SRAM cell 205 having a "zero" value, according to embodiments of the invention. Components from FIG. 3 may be referenced to describe the timing operation. At t1, the read enable (RE) operates the precharge logic to supply GBL 204 with a boosted read voltage and goes high. GBL 204 rises to the boosted read voltage of the boosted read line (V_PCH_R) 210. The word line (WL) 206 for an SRAM cell 205 goes high, opening the cell's pass transistors and keeping the local bit line (LBL) 301 precharged high and DC 304 low. At t2 the sense enable line (SE) 213 goes high and the voltage difference between GBL 204 and V_Ref drives the sense node true (SNT) 303 low, while the sense node complement (SNC) 304 remains high. SNC 304 is inverted and the data out line (D_OUT) 214 remains low. D_OUT 214 is sampled, and at t3 RE 209 and WL 206 go low, causing GBL 204 to return to the write precharge voltage of the write precharge line (V_PCH_W) 211.

Figure 4B:
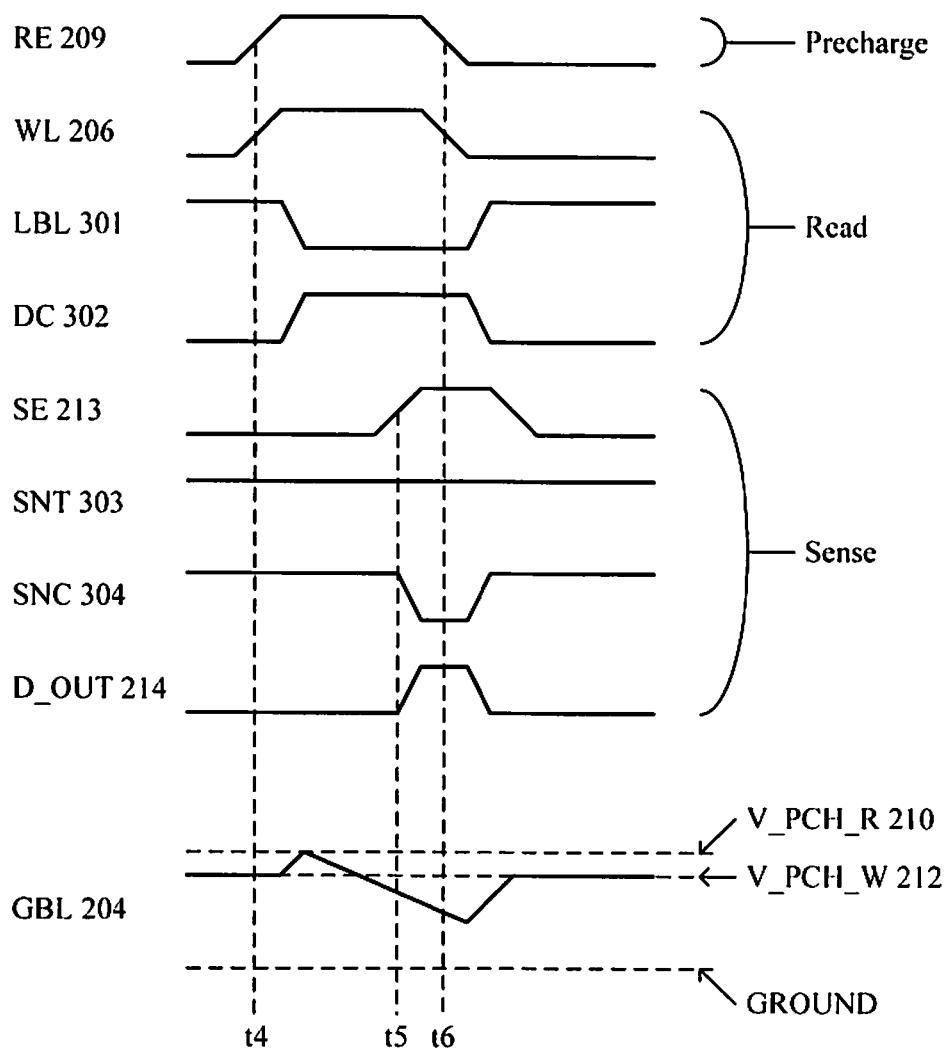
FIG. 4B is a timing diagram of a read operation of an SRAM cell having a "one" value, according to embodiments of the invention.

FIG. 4B is a timing diagram of a read operation of an SRAM cell having a "one" value, according to embodiments of the invention. At t4, RE goes high and GBL 204 rises to the boosted read voltage of V_PCH_R 210. WL 206 goes high, opening the cell's pass transistors. LBL 301 is pulled down and DC 304 goes high, causing GBL 204 to be discharged. At t5, once GBL 204 has had enough time to discharge below the reference voltage at all points, SE 213 goes high. This causes SNC 304 to go low and SNT 303 to remain high. SNC 304 is inverted and D_OUT 214 goes high. D_OUT 214 is sampled, and at t6 RE 209 and WL 206 go low, causing GBL 204 to return to the write precharge voltage of V_PCH_W 211, SNC 304 to return to a precharge high, and D_OUT 214 to return to an inverted low.

Data Structure

Figure 5:
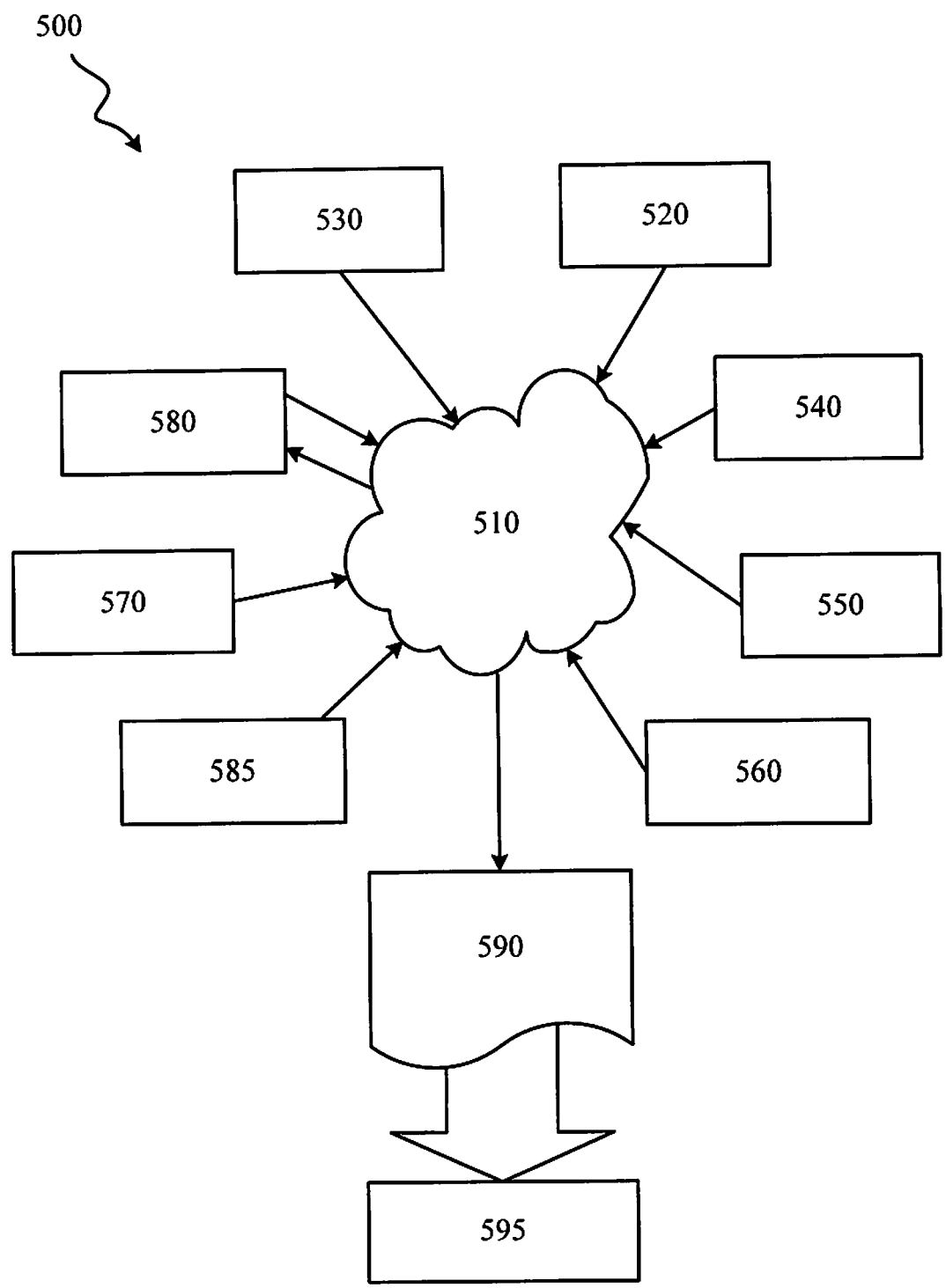
FIG. 5 is a flow diagram of a design process used in semiconductor design, manufacture, and/or test of the inventive SRAM depicted in FIGS. 2 and 3, according to embodiments of the invention.

FIG. 5 illustrates multiple design structures 500 including an input design structure 520 that is preferably processed by a design process. Design structure 520 may be a logical simulation design structure generated and processed by design process 510 to produce a logically equivalent functional representation of a hardware device. Design structure 520 may alternatively include data or program instructions that, when processed by design process 510, generate a functional representation of the physical structure of a hardware device. Whether representing functional or structural design features, design structure 520 may be generated using electronic computer-aided design, such as that implemented by a core developer/designer. When encoded on a machine-readable data transmission, gate array, or storage medium, design structure 520 may be accessed and processed by one or more hardware or software modules within design process 510 to simulate or otherwise functionally represent an electronic component, circuit, electronic or logic module, apparatus, device, or system such as those shown in FIGS. 2 and 3. As such, design structure 520 may include files or other data structures including human or machine-readable source code, complied structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 510 preferably employs and incorporates hardware or software modules for synthesizing, translating, or otherwise processing a design/simulation functional equivalent of the components, circuits, devices, or logic structures shown in FIGS. 2 and 3 to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describe the connections to other elements and circuits in an integrated circuit design. Netlist 580 may be synthesized using an iterative process in which Netlist 580 is resynthesized one or more times depending on design specifications and parameters for the device. As with other design structure types described herein, Netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510, without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures, along with any additional mechanical design or data, to generate a second design structure 590. Design structure 590 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIGS. 2 and 3. In one embodiment, design structure 590 may comprise a compiled, executable HDL simulation model that functionally simulates the devices shown in FIGS. 2 and 3.

Design structure 590 may also employ a data format used for the exchange of layout data of integrated circuits and/or symbolic data format (e.g., information stored in a GDSII, GL1, OASIS, map files, or any other suitable format for storing such design data structures). Design structure 590 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2 and 3. Design structure 590 may then proceed to a state 595 where, for example, design structure 590 proceeds to tape-out, is released to manufacturing, is released to a mask house, is sent to another design house, is sent back to the customer, etc.

Although the present invention has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the invention.

What is claimed is:

1. A domino SRAM (static random access memory), comprising:
    a local bit line;
    a global bit line;
    an SRAM cell coupled to the global bit line through the local bit line and configured to store one of a first logical value or a second logical value;
    precharge logic configured to precharge the global bit line to a non-zero precharge voltage for a period prior to a non-read operation and configured to charge the global bit line to a boosted voltage that is greater than the precharge voltage for a period prior to a read operation;
    discharge logic configured to maintain the global bit line at the boosted voltage for the read operation when reading the first logical value stored on the SRAM cell and configured to discharge the global bit line to a discharge voltage that is less than the precharge voltage for the read operation when reading the second logical value stored on the SRAM cell;
    and sense logic configured to output the first logical value when the global bit line is at the boosted voltage and configured to output the second logical value when the global bit line is at the discharge voltage.

2. The domino SRAM of claim 1, wherein the first logical value outputted by the sense logic is the complement of the first logical value and the second logical value outputted by the sense logic is the complement of the second logical value.

3. The domino SRAM of claim 1, wherein:
    a read enable line operates the precharge logic to precharge and charge the global bit line;
    a local bit line operates the discharge logic, wherein the local bit line is coupled to the SRAM cell and the global bit line; and
    a sense line enables the sense logic to output the first logical value for the boosted voltage and the second logical value for the discharge voltage.

4. The domino SRAM of claim 1, wherein the precharge voltage is a chip supply voltage.

5. The domino SRAM of claim 1, wherein the precharge logic is configured to precharge the global bit line to a write voltage for a write operation.

6. The domino SRAM of claim 5, wherein the write voltage is lower than the precharge voltage.

7. A design structure tangibly embodied in a machine-readable storage medium used in a design process of an SRAM, the design structure having elements that, when processed in a semiconductor manufacturing facility, produce an SRAM that comprises:

a local bit line;

a global bit line;

an SRAM cell coupled to the global bit line through the local bit line and configured to store one of a first logical value or a second logical value;

precharge logic configured to precharge the global bit line to a non-zero precharge voltage for a period prior to a non-read operation and configured to charge the global bit line to a boosted voltage that is greater than the precharge voltage for a period prior to a read operation;

discharge logic configured to maintain the global bit line at the boosted voltage for the read operation when reading the first logical value stored on the SRAM cell and configured to discharge the global bit line to a discharge voltage that is less than the precharge voltage for the read operation when reading the second logical value stored on the SRAM cell;

and sense logic configured to output the first logical value when the global bit line is at the boosted voltage and configured to output the second logical value when the global bit line is at the discharge voltage.

8. The design structure of claim 7, wherein the design structure comprises a Netlist which describes the SRAM.

9. The design structure of claim 7, wherein the design structure resides on a storage medium as a data format used for the exchange of layout data of integrated circuits.

10. The design structure of claim 7, wherein the design structure includes at least one set of test data files, characterization data, verification data, or design specifications.

* * * * *